United States Patent
Kumar

(10) Patent No.: US 11,824,525 B2
(45) Date of Patent: Nov. 21, 2023

(54) T-SWITCH WITH REDUCED CURRENT LEAKAGE

(71) Applicant: Microchip Technology Incorporated, Chandler, AZ (US)

(72) Inventor: Ajay Kumar, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 80 days.

(21) Appl. No.: 17/498,101

(22) Filed: Oct. 11, 2021

(65) Prior Publication Data

US 2022/0321117 A1    Oct. 6, 2022

Related U.S. Application Data

(60) Provisional application No. 63/169,571, filed on Apr. 1, 2021.

(51) Int. Cl.
*H03K 17/16* (2006.01)
*H03M 1/12* (2006.01)

(52) U.S. Cl.
CPC .............. *H03K 17/16* (2013.01); *H03M 1/12* (2013.01)

(58) Field of Classification Search
CPC ......... H03K 17/00; H03K 17/16; H03M 1/00; H03M 1/12

USPC .......................................................... 327/382
See application file for complete search history.

(56) References Cited

U.S. PATENT DOCUMENTS

| | | | |
|---|---|---|---|
| 2009/0153198 A1* | 6/2009 | Augustyniak | G11C 27/026 327/96 |
| 2012/0056661 A1* | 3/2012 | Shabra | H03K 17/693 327/436 |
| 2012/0318963 A1* | 12/2012 | Van Blerkom | H04N 25/75 250/214 P |

OTHER PUBLICATIONS

International Search Report and Written Opinion, Application No. PCT/US2022/022721, 12 pages.

\* cited by examiner

*Primary Examiner* — Daniel C Puentes
(74) *Attorney, Agent, or Firm* — SLAYDEN GRUBERT BEARD PLLC

(57) ABSTRACT

An apparatus is provided comprising a first t-switch, which includes an input port arranged to be connected to a first voltage source, a center-tap port, and an output port arranged to be connected to a load. The first t-switch is configured to connect the input port to the output port in an on mode and disconnect the input port from the output port in an off mode. The apparatus further comprises a bias voltage generation circuit configured to generate a bias voltage, the generated bias voltage coupled to the center-tap port of the first t-switch, the bias voltage determined based upon an output port voltage.

20 Claims, 6 Drawing Sheets

T-SWITCH WITH REDUCED CURRENT LEAKAGE

PRIORITY

The present application claims priority to U.S. Provisional Patent Application No. 63/169,571 filed Apr. 1, 2021, the contents of which are hereby incorporated in their entirety.

FIELD OF THE INVENTION

The present application relates to electronic switching and, more particularly, to a t-switch with reduced current leakage.

BACKGROUND

Various electronic devices and circuits use switches for input of voltage and voltage signals into the electronic devices and circuits. For example, analog to digital converters (ADC) may use switches to sample and hold or otherwise obtain input for analog voltage signals that are to be converted to digital values.

Switches may selectively connect an input and an output. Switches, which may be implemented fully, or in part, by transistors, may experience current leakage. Current leakage occurs when a switch is off or open, and current still flows from the input to the output (or vice-versa). When the switch is on, or closed, the input and the output may have a same voltage, or a same voltage less a small voltage drop due to the switch. When the switch is off, or closed, the input and the output may have a voltage differential. This voltage differential may cause the current leakage.

Inventors of examples of the present disclosure have discovered that current leakage may particularly impact analog to digital converter (ADC) applications. ADC applications may make use of a t-switch to select a voltage input to be converted to a digital code. The t-switch may selectively connect a voltage input to the ADC input. However, this may cause a voltage differential within the t-switch. The voltage differential may in turn cause a current leakage. The current leakage may be manifested as a loss of current or charge that would otherwise go into the ADC input and instead may go out another pin of the t-switch. Moreover, during the conversion process, input switches are kept 'open' or 'OFF' while the ADC converts the sampled voltage to a digital code. During this conversion process, any loss in sampled charge/voltage will result in error in converted digital code. The leakage current coming from all 'open' switch depletes the sampled charge or voltage which results in conversion error. The longer the ADC takes to convert a sampled voltage the more time leakage current have to deplete the sampled charge. The problem becomes more severe for a multi-channel ADC where leakage current may manifest in each of its inputs. For example, at a single channel 16-bit input with one million samples per second, such current leakage may cause 132 least significant bits of error at 125° C. (e.g., a digital sample value of 1000 would have an associated error of +/−66). This may make implementation of high accuracy ADCs, ADCs with sample and hold circuits, or high-input-channel ADCs difficult to implement. In some solutions, this leakage problem has been solved using two-stage input sampling. However, such a solution may use two sets of sampling networks. Each such network might be quite large in surface area. In addition, a charge-sharing phenomenon between the sampling capacitors of the two stages may also attenuate the sampled voltage to half its value. Furthermore, any mismatch errors between the sampling networks may also lead to an offset error. Examples of the present disclosure may address one or more of these challenges identified by the inventors.

SUMMARY

In some examples, an apparatus is provided comprising a first t-switch, which includes an input port arranged to be connected to a first voltage source, a center-tap port, and an output port arranged to be connected to a load. The first t-switch is configured to connect the input port to the output port in an on mode and disconnect the input port from the output port in an off mode. The apparatus further comprises a bias voltage generation circuit configured to generate a bias voltage, the generated bias voltage coupled to the center-tap port of the first t-switch, the bias voltage determined based upon an output port voltage.

In certain examples, the BVGC is configured to buffer the output port voltage to generate the bias voltage. In certain examples, the BVGC is configured to add an offset voltage to the output port voltage to generate the bias voltage. In certain examples, the apparatus further comprises a control logic wherein the control logic is configured to, in the off mode, cause the first t-switch to connect the bias voltage on the center-tap port to a midpoint between the input port and the output port of the first t-switch. In certain examples, the apparatus further comprises a control logic wherein the control logic is configured to, in the on mode, cause the first t-switch to disconnect the bias voltage on the center-tap port from a midpoint between the input port and from the output port of the first t-switch. In certain embodiments, the bias voltage is configured to reduce a voltage differential between the output port and the center-tap port in both the on mode and the off mode of the first t-switch as compared to application of a ground voltage to the center-tap port. In certain embodiments, application of the bias voltage to the center-tap port of the first t-switch is configured to reduce a current leak from the output port to the center-tap port of the first t-switch as compared to application of a ground voltage to the center-tap port. In certain embodiments, the BVGC is implemented with an operational amplifier with a first input connected to the output port voltage and a second input connected to feedback from an output of the operational amplifier. In certain examples, the first t-switch is implemented by a first sub-switch connected between the input port and a midpoint, a second sub-switch connected between the midpoint and the output port, and a third sub-switch connected between the midpoint and the center-tap port. In some examples, the first t-switch is configured to, in the on mode: close the first sub-switch, close the second sub-switch, and open the third sub-switch. In some examples, the first t-switch is configured to, in the off mode: open the first sub-switch, open the second sub-switch, and close the third sub-switch. In certain examples, the apparatus further comprises a plurality of second t-switches. Each second t-switch includes: an input port to be connected to a respective second voltage source, a center-tap port coupled to the generated bias voltage, and an output port to be connected to the load. Each second t-switch is configured to: connect the input port to the output port of the second t-switch in an on mode and disconnect the input port from the output port of the second t-switch in an off mode. The apparatus further comprises control logic configured to: select one of the first t-switch and the second t-switches, set the selected one of the first t-switch and the second t-switches to the on mode, and set all remaining ones of the first t-switch and the second t-switches to the off mode. In certain examples, the load is an analog to digital converter (ADC) including a sample and hold capacitor, the sample and hold capacitor configured to be reused with a digital to analog converter (DAC). In certain examples, the load is an analog to digital converter (ADC), the first t-switch and the plurality of second t-switches form an N:1 ADC input channel for the ADC (where N is greater than two). The control logic is further configured to: determine a selected voltage source from the first voltage source and the second voltage sources, the selected voltage source to be converted by the ADC and be set as the sampled voltage, and cause the N:1 ADC input channel to route the selected voltage source of the first voltage source and the second voltages sources to the ADC.

In some examples, a method is provided for controlling a first t-switch comprising an input port arranged to be connected to a first voltage source, a center-tap port, and an output port arranged to be connected to a load. The method comprises connecting the input port to the output port in an on mode, disconnecting the input port from the output port in an off mode, and generating a bias voltage coupled to the center-tap port of the first t-switch, wherein the bias voltage determined based upon an output port voltage.

In certain examples, the method further comprises buffering the output port voltage to generate the bias voltage. In certain examples, the method further comprises adding an offset voltage to the output port voltage to generate the bias voltage. In certain examples, the method further comprises, in the off mode, causing the first t-switch to connect the bias voltage on the center-tap port to a midpoint between the input port and the output port of the first t-switch. In certain examples, the method further comprises, in the on mode, causing the first t-switch to disconnect the bias voltage on the center-tap port from a midpoint between the input port and from the output port of the first t-switch. In certain examples, the method for additionally controlling a plurality of second t-switches, wherein each second t-switch includes an input port to be connected to a respective second voltage source, a center-tap port coupled to the generated bias voltage, and an output port to be connected to the load. The method further comprises selecting one of the first t-switch and the second t-switches, setting the selected one of the first t-switch and the second t-switches to the on mode, and setting all remaining ones of the first t-switch and the second t-switches to the off mode.

DETAILED DESCRIPTION

Figure 1:
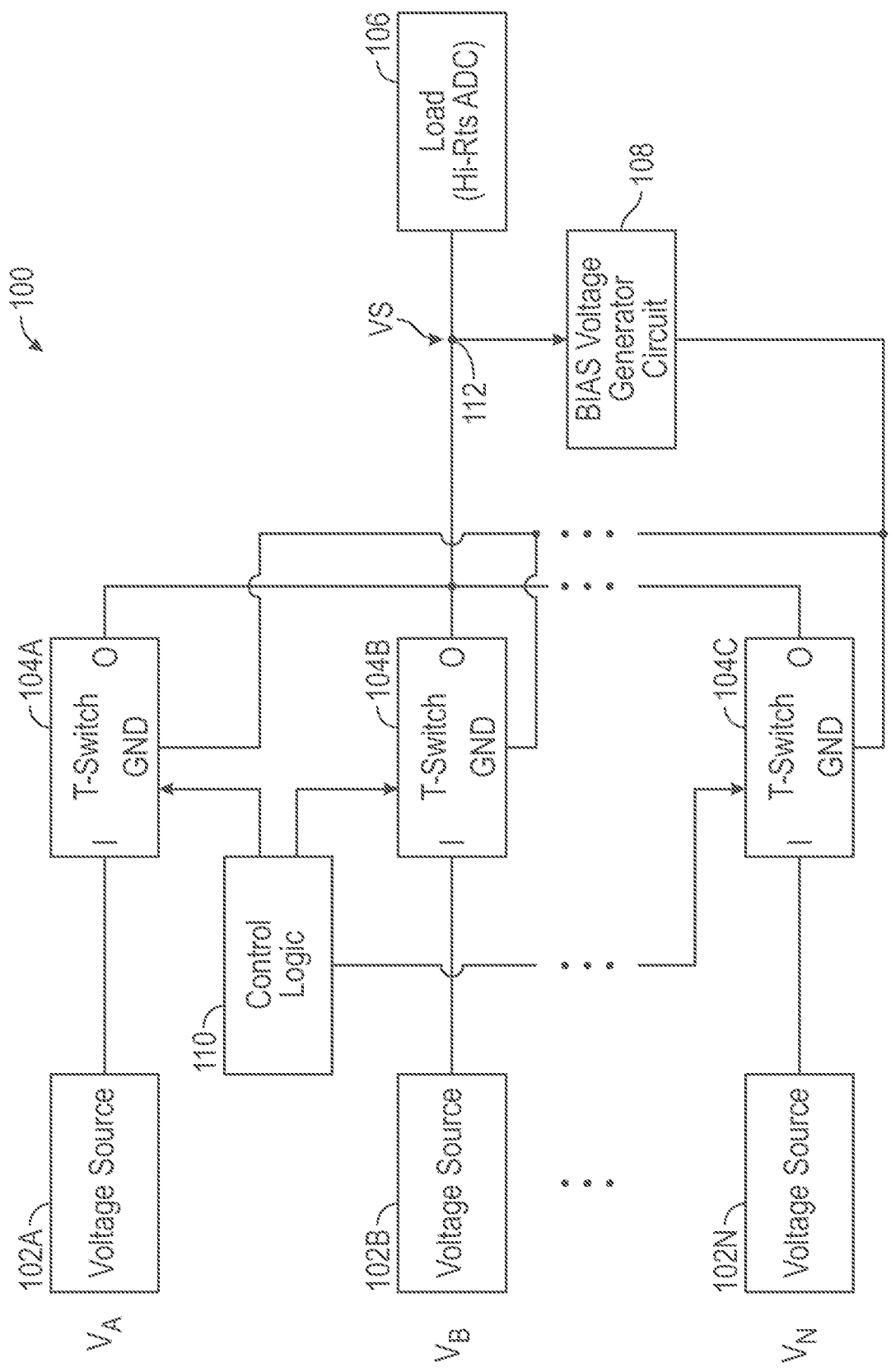
FIG. 1 is an illustration of an example system with switched voltage sources as applied to a load using a t-switch with reduced current leakage, according to examples of the present disclosure.

FIG. 1 is an illustration of an example system 100 with switched voltage sources applied to a load using a plurality of t-switches, each with reduced current leakage, according to examples of the present disclosure.

System 100 may be implemented within any suitable context, such as within a controller, microcontroller, die, integrated circuit, system on a chip, application specific integrated circuit, field programmable gate array, computer, mobile device, power supply, peripheral, analog to digital converter (ADC), or any other suitable electronic device.

System 100 may include a load 106 that is to be provided an input voltage, referenced in FIG. 1 as a sampled voltage or VS. The voltage may be sampled by a given t-switch. Although referred to as a load, load 106 may be implemented by any suitable element that receives sampled voltage VS as an input, whether or not such a sampled voltage VS is to be used for power or as a signal. For example, load 106 may be implemented by an ADC. The ADC may be configured to convert a selected input that is applied as the sampled voltage VS to the ADC. Moreover, in one example, the ADC may be a high-resolution ADC. Such a high-resolution ADC may have tight tolerances regarding current or charge leakage out from its inputs.

For example, system 100 may include two or more possible sources of voltage to be applied as the sampled voltage VS to load 106, such as voltage sources 102A-N. Each of voltage sources 102A-N may have a respective voltage value, denoted respectively as voltage values VA-VN. System 100 may be configured to selectively route an output of one of voltage sources 102A-N, thus causing the corresponding voltage value of VA-VN to be applied to load 106 as sampled voltage VS.

System 100 may include any suitable components to selectively route output of one of voltage sources 102A-N, thus causing voltage of a respective one of voltage values VA-VN to be applied to load 106 as sampled voltage VS. For example, system 100 may include t-switches 104A-N. Each of t-switches 104A-N may be configured to selectively route output of voltage sources 102A-N, thus causing voltage of a respective one of voltage values VA-VN to be applied to load 106 as sampled voltage VS. In one example, a single one of t-switches 104 may be configured to route output of a selected one of voltage sources 102A-N to load 106 as sampled voltage VS, while other ones of t-switches 104 may be configured to disable the routing of their respective voltage sources 102A-N to load 106.

Operation of t-switches 104A-N to selectively route signals between their inputs and outputs may be provided by a control logic 110 of system 100. Control logic 110 may be implemented in any suitable manner, such as by analog circuitry, digital circuitry, instructions stored on a machine-readable medium (not shown) for execution by a processor (not shown), or any suitable combination thereof. Control logic 110 may be configured to provide control signals to t-switches 104A-N on the basis of user settings, system settings, register values, instructions, or upon any suitable basis.

Each t-switch 104 may include a control input to receive control signals from control logic 110. The control input may include a control port or a control pin. Moreover, each t-switch 104 may include an input port, which may be an input pin. The input port may be connected to a respective voltage source 102. Each t-switch 104 may include an output port, which may be an output pin. The output port may be connected to load 106. Moreover, the output port may be connected to a VS junction 112, which may be a node of an intersection of wires. Thus, each of the output ports from t-switches 104A-N may be connected together at VS junction 112 for connection to load 106. When a given t-switch 104 is turned on, or operating in an on mode, responsive to a signal at the respective control input, t-switch 104 may connect its input port to its output port. When a given t-switch 104 is turned off, or operating in an off mode, t-switch 104 may disconnect its input port from its output port.

Each t-switch 104 may include a center-tap port, which may be coupled to a reference voltage (e.g., a ground voltage) or a bias voltage described below. In one example, in an off mode, or when a given t-switch is turned off, t-switch 104 may connect its center-tap port to a midpoint between its input and output ports. Such a midpoint may itself be electrically isolated from both the input and output ports, as t-switch 104 has disconnected its input port and its output ports. In one example, in an on mode, or when a given t-switch is turned on, t-switch 104 may disconnect its center-tap port to the midpoint between its input and output ports. Such a midpoint may itself be electrically connected to both the input and output ports in the on mode, as t-switch 104 has connected its input port to its output ports. Although described as a midpoint, the midpoint need not be a physical midpoint between the input and output ports. The midpoint may be any point electrically connected between the input and output ports.

In some operations, only a single one of t-switches 104A-N might be in an on mode, or closed, at a time. The others of t-switches 104A-N might be in an off mode, or open. The single one of t-switches 104A-N may be selected to route the output of the corresponding voltage source 102 to load 106, thus causing the correspond voltage value (of a value of voltage values VA-VN) to be applied to load 106 as sampled voltage VS. This may be used in, for example, ADC operations.

A voltage differential may arise in a given t-switch 104 based upon a voltage difference between the input port and the center-tap port, or the output port and the center-tap port. System 100 may be configured to reduce the voltage differential in t-switch 104 between the center-tap port and the input or output ports in any suitable manner. In one example, system 100 may include a bias voltage generator circuit (BVGC) 108 configured to reduce the voltage differential in t-switch 104 between the center-tap port and the input or output ports. BVGC 108 may be implemented in any suitable manner, such as by analog circuitry, digital circuitry, instructions stored on a machine-readable medium (not shown) for execution by a processor (not shown), or any suitable combination thereof. BVGC 108 may be connected to VS junction 112 to access the sampled voltage VS to be applied to load 106. Thus, BVGC 108 may be connected to common output load VS from each of t-switches 104A-N.

BVGC 108 may be configured to bias the center-tap port of a given t-switch 104. BVGC 108 may be configured to bias the center-tap port of t-switch 104 in any suitable manner. For example, BVGC 108 may be configured to generate a bias voltage. BVGC 108 may be configured to apply the bias voltage to the center-tap ports of t-switches 104A-N. BVGC 108 may be configured to reduce the voltage differential between the center-tap port and the input and output ports of t-switches 104A-N through application of the bias voltage.

BVGC 108 may be configured to generate the bias voltage in any suitable manner. In one example, BVGC 108 may be configured to generate the bias voltage, the bias voltage determined based upon the t-switch output voltage (here referenced as sampled voltage VS) to be applied to load 106. The term bias voltage as used herein refers to the value of the bias voltage. BVGC 108 may be configured to approximate the bias voltage to be approximately equal to the output voltage (e.g., sampled voltage VS). For example, BVGC 108 may be configured to buffer the output voltage (e.g., sampled voltage VS) applied to load 106 to generate the bias voltage. In a further example, BVGC 108 may be configured to buffer the output voltage (e.g., sampled voltage VS) to generate the bias voltage using an operational amplifier, as shown in more detail in FIG. 2.

The bias voltage applied to the center-tap port of t-switch 104 may be configured to reduce a voltage differential between the output port and the center-tap port of t-switch 104, as compared to a ground voltage applied to the center-tap port of t-switch. The bias voltage applied to the center-tap port of t-switch 104 may be configured to reduce a voltage differential between the output port and the center-tap port of t-switch 104 whether t-switch 104 is in an on mode or an off mode.

Figure 2:
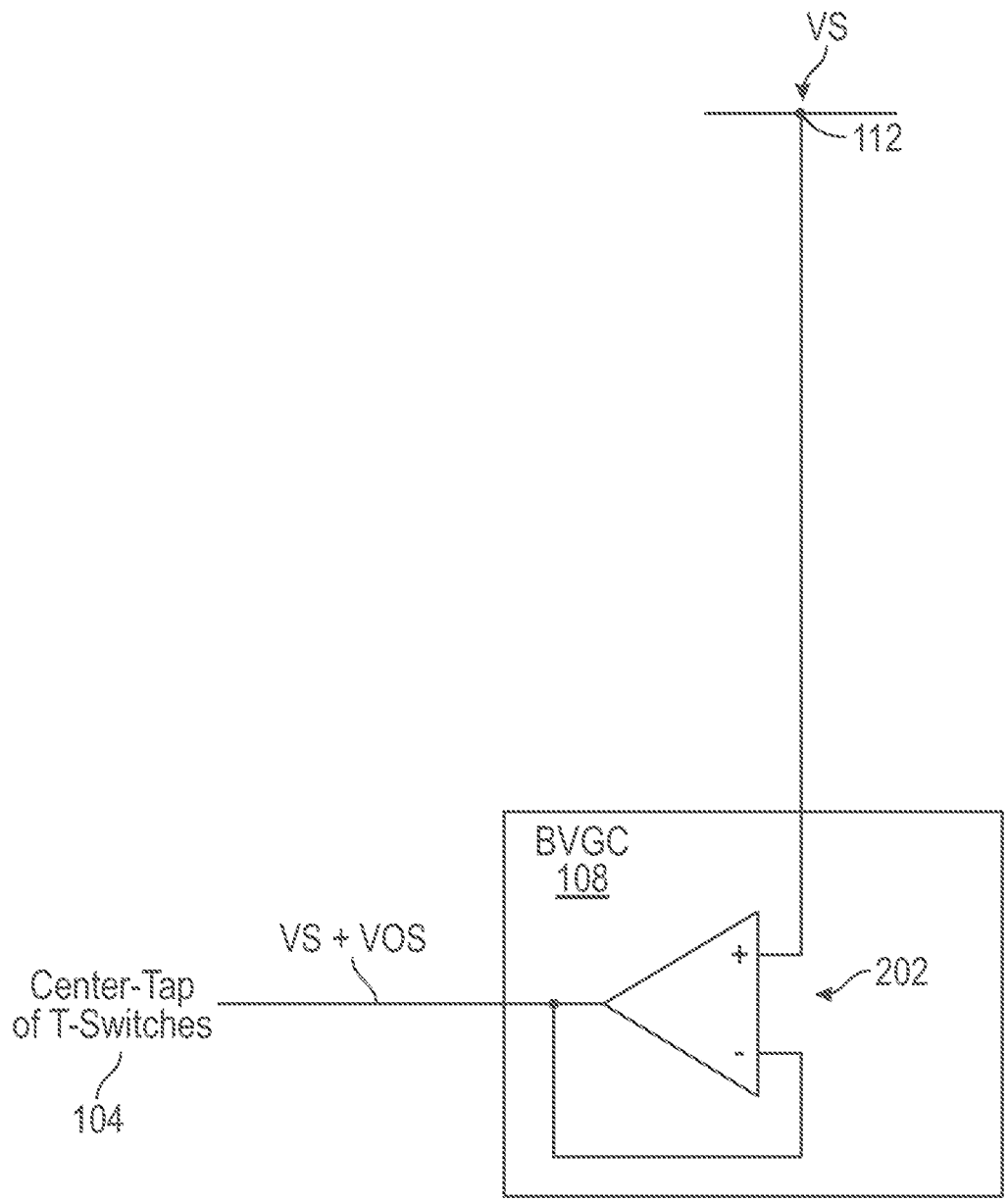
FIG. 2 is a more detailed illustration of a bias voltage generation circuit, according to examples of the present disclosure.

FIG. 2 is a more detailed illustration of a BVGC 108, according to examples of the present disclosure.

BVGC 108 may include an op-amp 202 configured to generate the bias voltage based upon the sampled voltage VS applied to load 106. Op-amp 202 may be implemented as an op-amp follower or buffer with a theoretical gain of 1.

An input of BVGC 108 may be connected to VS junction 112. As indicated above, VS junction 112 may be configured to exhibit a sampled voltage VS. BVGC 108 may accept sampled voltage VS as an input and route sampled voltage VS to a non-inverting input of op-amp 202. An output of op-amp 202 may be routed in feedback to the inverting input of op-amp 202. The output of op-amp 202 may be the buffered voltage, or feedback voltage.

Ideally, if both inputs of op-amp 202 are at the same voltage, as would otherwise be expected from a steady-state value of sampled voltage VS, then output of op-amp 202 would be sampled voltage VS. However, actual implementations of op-amp 202 may cause op-amp 202 to add a small offset voltage, VOS, to the sampled voltage VS. Thus, the output of op-amp 202, and thus the output of BVGC 108, may be VS+VOS. This voltage VS+VOS may be the bias voltage to be generated by BVGC 108, and may be routed to each of the center-tap ports of t-switches 104A-N.

Returning to FIG. 1, as the bias voltage is applied by BVCG 108 to the center-tap ports of t-switches 104A-N, the voltage differential in a given t-switch 104 may be greatly reduced. Thus, may in turn reduce current or charge leakage. The voltage differential between the center-tap port and output port of a given t-switch 104 may be VOS.

Figure 3:
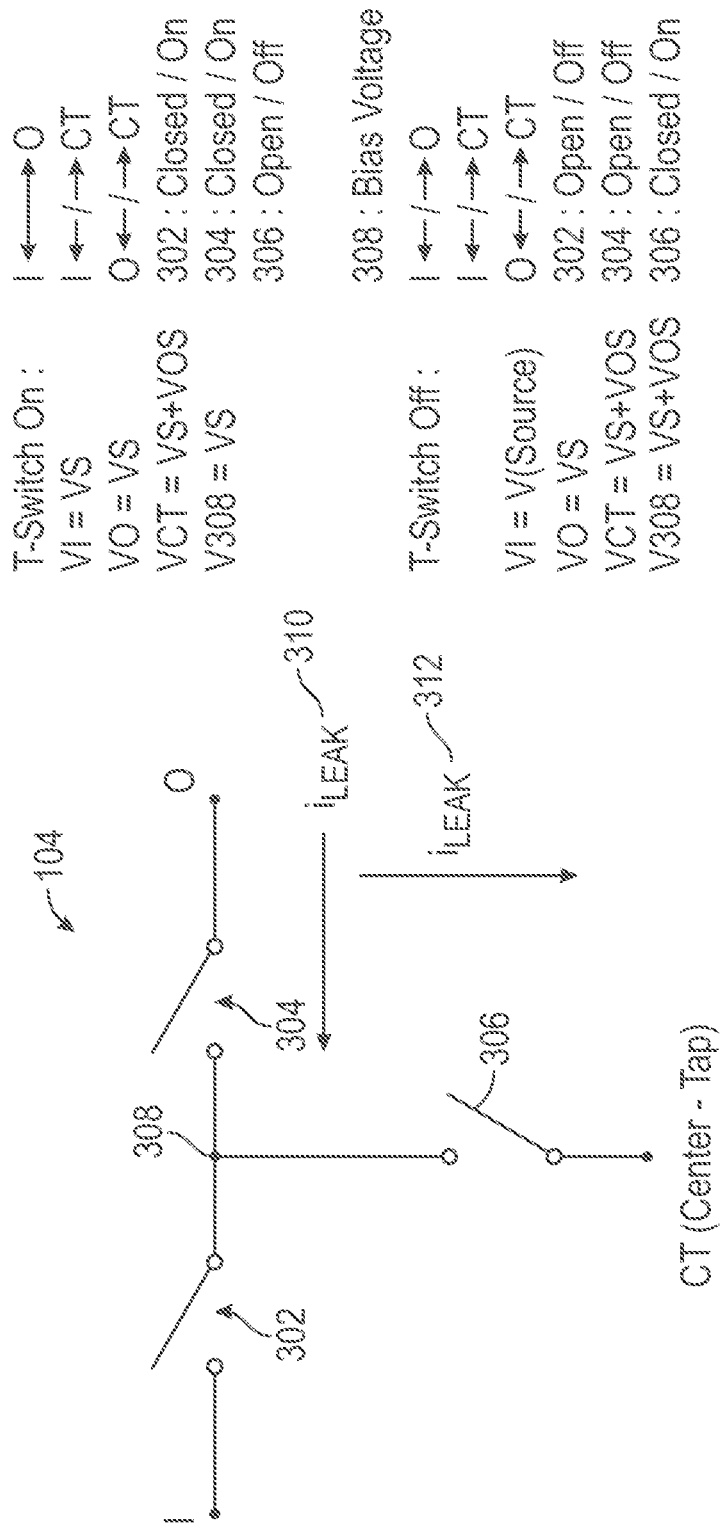
FIG. 3 is a more detailed illustration of a t-switch with reduced current leakage and operation thereof, according to examples of the present disclosure.

FIG. 3 is a more detailed illustration of a t-switch 104 with reduced current leakage and operation thereof, according to examples of the present disclosure. In particular, FIG. 3 illustrates example implementations of a t-switch 104 and voltage differentials experienced in different modes of operation.

T-switch 104 may be implemented with sub-switches therein. For example, t-switch 104 may include a sub-switch 302. A first end of sub-switch 302 may be connected to the input port. Sub-switch 302 may be configured to alternately connect or isolate the input port from the rest of the connections and components of t-switch 104. T-switch 104 may include a sub-switch 304. A first end of sub-switch 304 may be connected to the output port. Sub-switch 304 may be configured to alternately connect or isolate the output port from the rest of the connections and components of t-switch 104. T-switch 104 may include a sub-switch 306. A first end of sub-switch 306 may be connected to the center-tap port. Sub-switch 306 may be configured to alternately connect or isolate the center-tap port from the rest of the connections and components of t-switch 104. A second end of each of sub-switches 302, 304, 306 may be connected to a common midpoint 308. Each of sub-switches 302, 304, 306 may be implemented in any suitable manner, such as by a suitable switch or transistor. Operation of sub-switches 302, 304, 306 may be made by control signals from control logic 110 applied to the control port (not shown). A voltage differential across any one of sub-switches 302, 304, 306, whether positive or negative, may cause current leakage, whether positive or negative. Although described as a midpoint, midpoint 308 need not be a physical midpoint between the input and output ports, or a physical midpoint between sub-switches 302, 304, 306. Midpoint 308 may be any point electrically connected between sub-switches 302, 304, 306.

When t-switch 104 is in an on mode, or closed, the input and output ports may be connected. This may be performed by closing sub-switches 302, 304. The input and center-tap ports may be disconnected. This may be performed by opening sub-switch 306. The output and center-tap ports may similarly be disconnected. Midpoint 308 may be connected to the input and output ports. T-switch 304 may be set to the on mode by control logic 110 causing disconnection of bias voltage (which is on the center-tap port) from midpoint 308 by closing sub-switches 302, 304 and opening sub-switch 306.

Thus, when t-switch 104 is in an on mode, or closed, voltage at the input port may be sampled voltage VS (less any voltage drop due to the t-switch). Voltage at the output port may be sampled voltage VS. Voltage at the center-tap port may be VS+VOS. Voltage at midpoint 308 may be sampled voltage VS. This may result in a maximum voltage differential across sub-switch 306 of VOS. This may reduce current leakage, denoted as $i_{LEAK}$ 312, from midpoint 308 to the center-tap port. Such current leakage may withdraw current from the input port that was to go to load 106.

When t-switch 104 is in an off mode, or open, the input and output ports may each be disconnected from midpoint 308. The input port therefore may be disconnected from the center-tap port. Midpoint 308 may be connected to the center-tap port. In particular, sub-switch 302 may be open, or off, sub-switch 304 may be open, or off, and sub-switch 306 may be on, or closed. This may be performed by control logic 110 causing connection of bias voltage on the center-tap port to midpoint 308 by opening sub-switches 302, 304 and closing sub-switch 306.

Thus, when t-switch 104 is in an off mode, or open, voltage at the input port may be the voltage of voltage source 102 corresponding to t-switch 104, denoted as V(Source). Voltage at the output port may be sampled voltage VS. Voltage at the center-tap port may be VS+VOS. Voltage at midpoint 308 may be VS+VOS. This may result in a maximum voltage differential across sub-switch 304 of VOS. This may reduce current or charge leakage, denoted as $i_{LEAK}$ 310, from the output port to the midpoint 308. In turn, this may reduce current or charge leakage from the output port to the center-tap port, which is connected to midpoint 308. Such current leakage may be drawn from inputs to load 106. There may be a voltage differential across sub-switch 302 of a quantity V(Source)−(VS+VOS). This may cause a current leakage from voltage source 102 to the center-tap port, but this might not affect load 106 in the same manner as $i_{LEAK}$ 310 and $i_{LEAK}$ 312.

Accordingly, application of bias voltage from BVGC 108 to the center-tap ports of t-switches 104A-N may result in a lower voltage differential between midpoint 308 and the center-tap port (and thus across sub-switch 306) when a given t-switch 104 is in an on mode, or closed, compared to if the center-tap port was simply connected to zero volts (i.e., ground). In such an implementation, the voltage differential would be sampled voltage VS, rather than VOS.

Moreover, application of bias voltage from BVGC 108 to the center-tap ports of t-switches 104A-N may result in a lower voltage differential between the output port and midpoint 308 (and thus across sub-switch 304) when a given t-switch 104 is in an off mode, or open, compared to if center-tap port was simply connected to zero volts (i.e., ground). In such an implementation, the voltage differential would be sampled voltage VS, rather than VOS.

Sampled voltage VS may be as much as the highest voltage allowed of system 100, which may be, for example, a system VDD of, for example, 3.3 V, 5 V, or a highest sampled voltage. In contrast, VOS may as little as the offset of the buffer amplifier of op-amp 202 or may typically be 6 mV. This reduction in voltage differential may cause a reduction in current leakage when BVGC 108 is used to generate and apply a bias voltage to the center-tap ports of t-switches 104A-N, instead of simply connecting the center-tap port to zero volts or a ground voltage. While other reference voltages may be used, in place of ground, such a fixed reference voltage might still result in varying significant voltages cross sub-switch 306 and sub-switch 304, whereas the present examples provide for a fixed voltage differential equal to about VOS.

Accordingly, in both the on mode and off mode of t-switch 104, the bias voltage applied by BVGC 108 to the center-tap port may be configured to reduce a voltage differential between the output port and the center-tap port. In both such cases, the differential may be VOS, as the output port is at sampled voltage VS and the center-tap port is at VS+VOS. The bias voltage may reduce these voltage differentials as compared to application of zero volts or another voltage reference to the center-tap port.

Figure 4:
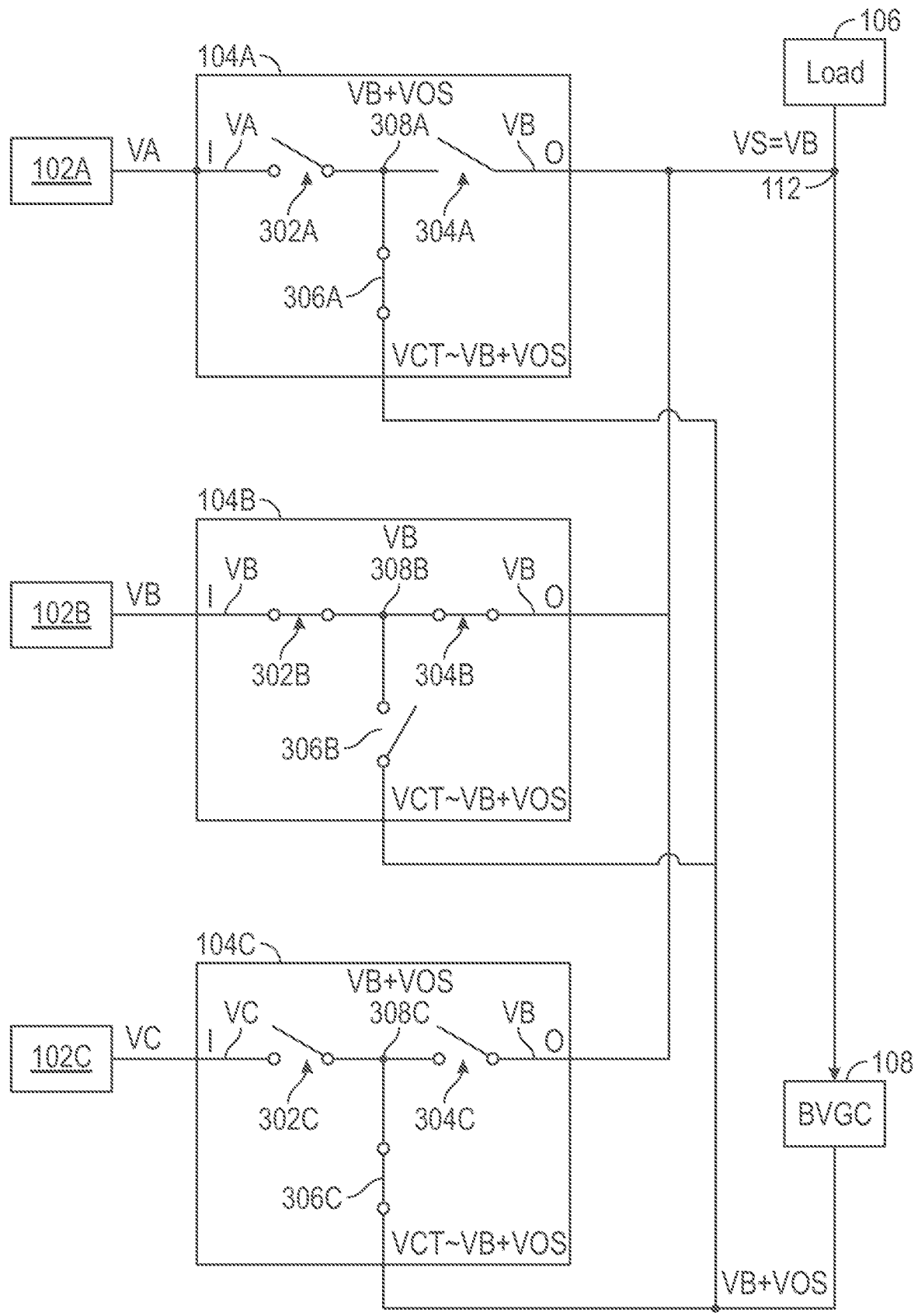
FIG. 4 is an illustration of operation of a system with switched voltage sources as applied to a load using a t-switch with reduced current leakage, according to examples of the present disclosure.

FIG. 4 is an illustration of operation of system 100 with switched voltage sources as applied to a load using a t-switch with reduced current leakage, according to examples of the present disclosure.

In FIG. 4, voltage source 102A may have a voltage value of VA applied to the input port of t-switch 104A. Voltage source 102B may have a voltage value of VB applied to the input port of t-switch 104B. Voltage source 102C may have a voltage value of VC applied to the input port of t-switch 104C.

Control logic 110 (not shown) may have determined that voltage value VB from voltage source 102B is to be routed to load 106. The other voltages, i.e., the voltage value V1 and the voltage value V3 from voltage sources 102A, 102C, are not to be used. Thus, control logic 110 may instruct t-switch 104A to operate in an off mode. Control logic 110 may instruct t-switch 104B to operate in an on mode. Control logic 110 may instruct t-switch 104C to operate in an off mode.

T-switch 102B may be configured to turn on, or close, sub-switches 302B, 304B and to turn off, or open, sub-switch 306B. Accordingly, voltage at the input port of t-switch 102B may be the voltage value VB. Voltage at the output port may be the voltage value VB. Voltage at load 106 may be sampled voltage VS, and may also be the voltage value VB. The voltage value VB may be routed as sampled voltage VS to BVGC 108. BVGC 108 may output a bias voltage equal to VB+VOS. This bias voltage may be routed to the center-tap port of each of t-switches 102. Accordingly, the voltage at the center-tap port of t-switch 102B may be VB+VOS. Moreover, the voltage at midpoint 308B may be the voltage value VB. Thus, the voltage differential across sub-switch 306B may be only VOS. This may also be the voltage differential between the output port and the center-tap port. Thus, in the on mode, t-switch 102B is configured to cause a voltage differential between the output port and the center-tap port to be the offset voltage generated by BVGC 108.

T-switch 102A may be configured to turn off, or open, sub-switches 302A, 304A and to turn on, or close, sub-switch 306A. Accordingly, voltage at the input port may be the voltage value VA. Voltage at the output port may be the voltage value VB, as the output port is connected to VS junction 112 and thus to the output of t-switch 102B. Voltage at the center-tap port may be VB+VOS, as generated by BVGC 108. Moreover, the voltage at midpoint 308A may be VB+VOS. Thus, the voltage differential across sub-switch 304A may be merely VOS. Thus, in the off mode, t-switch 102A may be configured to cause a voltage differential between the output port and the center-tap port to be the offset voltage generated by BVGC 108.

Similarly, t-switch 102C may be configured to turn off, or open, sub-switches 302C, 304C and to turn on, or close, sub-switch 306C. Accordingly, voltage at the input port may be the voltage value VC. Voltage at the output port may be the voltage value VB, as the output port is connected to VS junction 112 and thus to the output of t-switch 102B. Voltage at the center-tap port may be VB+VOS, as generated by BVGC 108. Moreover, the voltage at midpoint 308C may be VB+VOS. Thus, the voltage differential across sub-switch 304C may be merely VOS. Thus, in the off mode, t-switch 102C may be configured to cause a voltage differential between the output port and the center-tap port to be the offset voltage generated by BVGC 108.

Figure 5:
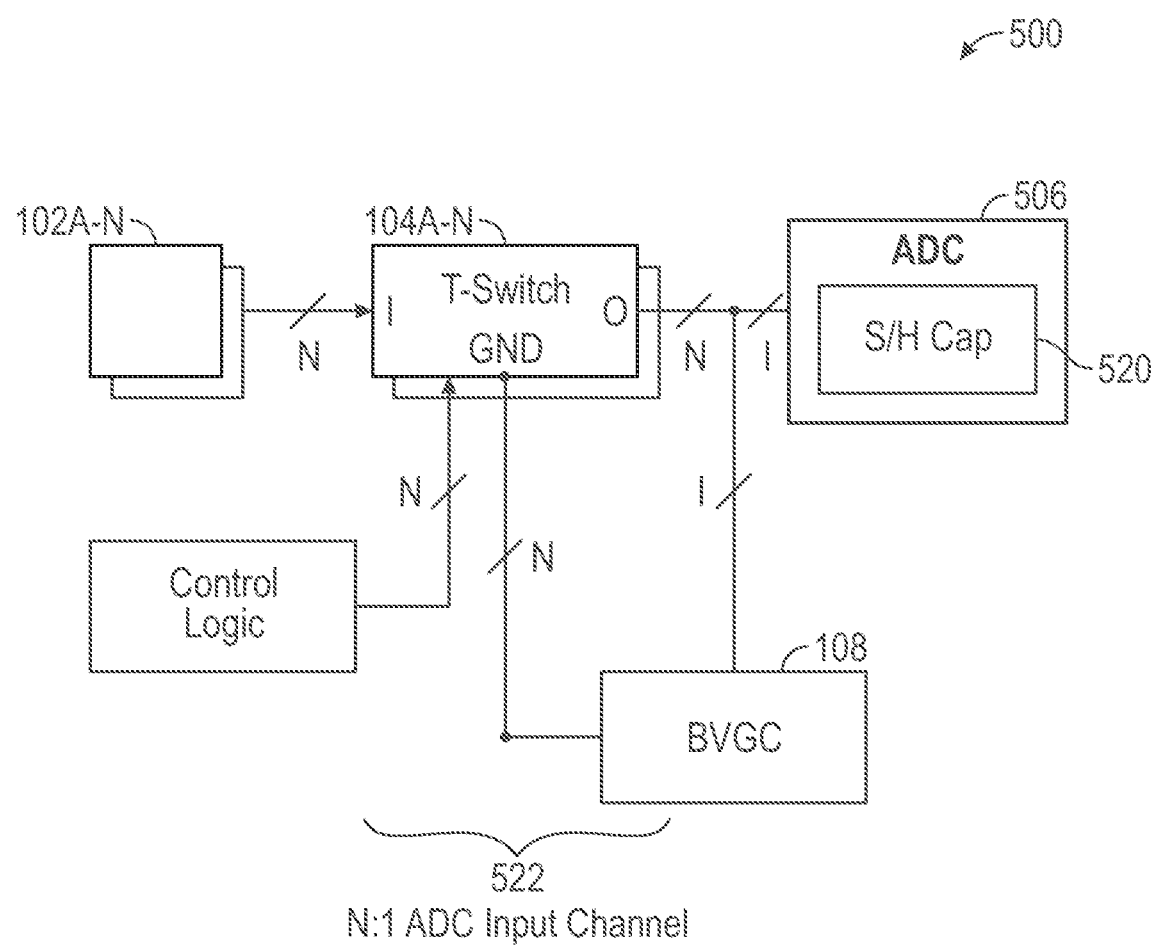
FIG. 5 is an illustration of an ADC system utilizing a t-switch with reduced current leakage, according to examples of the present disclosure.

FIG. 5 is an illustration of an ADC system 500 utilizing a t-switch with reduced current leakage, according to examples of the present disclosure. System 500 may be a more specific implementation of system 100. Load 106 may be implemented as an ADC 506. In one example, ADC 506 may be a high-resolution ADC. In another example, ADC 506 may be implemented using a sample and hold circuit 520, such as a sample and hold capacitor. Sample and hold circuit 520, such as the sample and hold capacitor, may be configured to be reused with a digital to analog converter (DAC) (not shown). Moreover, the combination of t-switches 104A-N may represent an N:1 ADC input channel 522 for ADC 520.

Control logic 110 may be configured to determine which of voltage sources 102A-N is to be routed to ADC 506 as an analog signal to be converted into a digital signal. Control logic 110 may thus determine which of t-switches 104A-N is to provide the sampled voltage VS to ADC 506. Control logic 110 may issue control signals to t-switches 104A-N, setting the corresponding, selected one of t-switches 104A-N to the on mode. Control logic 110 may set all remaining ones of t-switches 104A-N to the off mode.

Application of bias voltage by BVGC 108 to center-tap ports of t-switches 104A-N may sufficiently reduce current leakage so that a sample and hold capacitor of sample and hold circuit 520 may be usable in a high-resolution implementation of ADC 506. As discussed above, without use of bias voltage as applied to center-tap ports of t-switches 104A-N, a voltage differential across sub-switches within a given t-switch 104 may be as high as VDD or another maximum voltage of the input, the upper voltage input of ADC 506. A typical system may use 3.3 V as VDD. Thus, the voltage differential may be as high as 3.3. V across a given sub-switch, which may cause significant current leakage. In contrast, by applying bias voltage from BVGC 108 to center-tap ports of t-switches 104A-N, the voltage differential may be VOS, which may typically be 6 mV. This may represent a 500-fold improvement in current leakage reduction. This may enable use of single stage sample and hold capacitor of sample and hold circuit 520, which requires half the capacitance and half the complexity as compared to using a two-stage input sampling. Capacitor requirements may be reduced, for example, from 60 pF down to 30 pF. Moreover, since the current leakage from a given t-switch 104 is so low, many more t-switches 104A-N may be connected for possible inputs to ADC 506. In other applications where a 16-bit or 18-bit ADC is used, high current leakage previously limited designs to one or two voltage sources connected by different t-switches. However, in the example of FIG. 5, more than two voltage sources may be used. For example, N:1 ADC input channel 522 may have 16 or 32 instances of t-switch 104.

Figure 6:
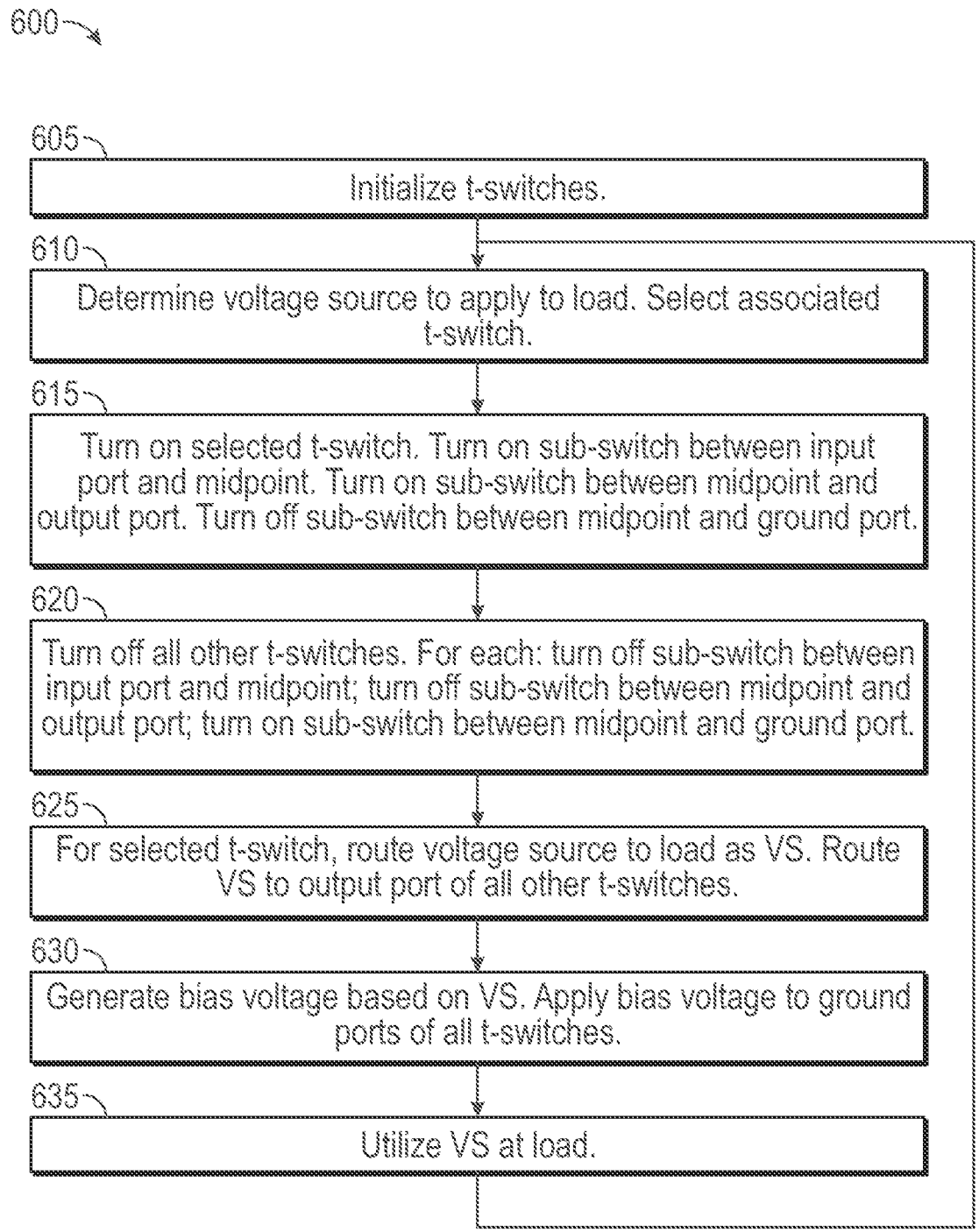
FIG. 6 is an illustration of a method of operating a system with a t-switch with reduced current leakage, according to examples of the present disclosure.

FIG. 6 is an illustration of a method 600 of operating a system with a t-switch with reduced current leakage, according to examples of the present disclosure. Method 600 may be performed by any suitable mechanism, such as system 100 or system 500. In particular, method 600 may be performed by one or more of control logic 110, BVGC 108, and t-switches 104A-N. Method 600 may begin at any suitable block and upon any suitable criteria. Method 600 may optionally repeat. Method 600 may be performed with fewer or more blocks than shown in FIG. 6. Moreover, blocks of method 600 may be omitted, repeated, performed in parallel, performed in a different order than shown in FIG. 6, or performed recursively. One or more blocks of method 600, although shown in an order, may be performed at the same time or in a reordered manner.

Method 600 may begin at block 605. At block 605, t-switches may be initialized for input.

At block 610, a voltage source to be applied to a load may be determined. This may include selecting a t-switch that is associated with the voltage source to be applied to the load.

At block 615, the selected t-switch may be placed in an on mode. This may include turning on a sub-switch located between an input port and a midpoint of the t-switch. A sub-switch located between the midpoint and an output port of the t-switch may be turned on. A sub-switch located between the midpoint and a center-tap port of the t-switch may be turned off.

At block 620, the other t-switches may be placed in an off mode. For each such t-switch, this may include turning off a sub-switch located between an input port and a midpoint of the t-switch. A sub-switch located between the midpoint and an output port of the t-switch may be turned off. A sub-switch located between the midpoint and a center-tap port of the t-switch may be turned on.

At block 625, for the selected t-switch, the voltage source may be routed to the load as sampled voltage VS. Sampled voltage VS may be routed to the output port of all other t-switches.

At block 630, a bias voltage may be generated based upon the sampled voltage VS. The bias voltage may be applied to the center-tap ports of all the t-switches.

At block 635, sampled voltage VS may be utilized by the load. For example, an analog voltage value of sampled voltage VS may be converted into a digital value. Method 600 may return to block 610.

Although examples have been described above, other variations and examples may be made from this disclosure without departing from the spirit and scope of these examples.

We claim:

1. An apparatus, comprising:
   a first t-switch, including:
      an input port arranged to be connected to a first voltage source;
      a center-tap port; and
      an output port arranged to be connected to a load;
      wherein the first t-switch is to:
         connect the input port to the output port in an on mode; and
         disconnect the input port from the output port in an off mode; and
   a bias voltage generation circuit (BVGC) having an input coupled to the output port of the first t-switch to generate a bias voltage, the generated bias voltage coupled to the center-tap port of the first t-switch, the bias voltage determined based upon a voltage of the output port, and wherein the bias voltage is determined independent of any voltage downstream of the output port.

2. The apparatus of claim 1, wherein the BVGC is to buffer the output port voltage to generate the bias voltage.

3. The apparatus of claim 1, wherein the BVGC is to add an offset voltage to the output port voltage to generate the bias voltage.

4. The apparatus of claim 1, further comprising a control logic, the control logic to, in the off mode, cause the first t-switch to connect the bias voltage on the center-tap port to a midpoint between the input port and the output port of the first t-switch.

5. The apparatus of claim 1, further comprising a control logic, the control logic to, in the on mode, cause the first t-switch to disconnect the bias voltage on the center-tap port from a midpoint between the input port and from the output port of the first t-switch.

6. The apparatus of claim 1, wherein the bias voltage is to reduce a voltage differential between the output port and the center-tap port in both the on mode and the off mode of the first t-switch as compared to application of a ground voltage to the center-tap port.

7. The apparatus of claim 1, wherein application of the bias voltage to the center-tap port of the first t-switch is to reduce a current leak from the output port to the center-tap port of the first t-switch as compared to application of a ground voltage to the center-tap port.

8. The apparatus of claim 1, wherein the BVGC is implemented with an operational amplifier with a first input connected to the output port voltage and a second input connected to feedback from an output of the operational amplifier.

9. The apparatus of claim 1, wherein the first t-switch is implemented by a first sub-switch connected between the input port and a midpoint, a second sub-switch connected between the midpoint and the output port, and a third sub-switch connected between the midpoint and the center-tap port.

10. The apparatus of claim 9, wherein the first t-switch is to, in the on mode:
    close the first sub-switch;
    close the second sub-switch; and
    open the third sub-switch.

11. The apparatus of claim 9, wherein the first t-switch is to, in the off mode:
    open the first sub-switch;
    open the second sub-switch; and
    close the third sub-switch.

12. The apparatus of claim 1, further comprising:
    a plurality of second t-switches, wherein:
       each second t-switch includes:
          an input port to be connected to a respective second voltage source;
          a center-tap port coupled to the generated bias voltage; and
          an output port to be connected to the load; and
       each second t-switch is to:
          connect the input port to the output port of the second t-switch in an on mode; and
          disconnect the input port from the output port of the second t-switch in an off mode; and
    control logic to:
       select one of the first t-switch and the second t-switches;
       set the selected one of the first t-switch and the second t-switches to the on mode; and
       set all remaining ones of the first t-switch and the second t-switches to the off mode.

13. The apparatus of claim 12, wherein the load is an analog to digital converter (ADC) including a sample and hold capacitor, the sample and hold capacitor to be reused with a digital to analog converter (DAC).

14. The apparatus of claim 12, wherein:
    the load is an analog to digital converter (ADC);
    the first t-switch and the plurality of second t-switches form an N:1 ADC input channel for the ADC, wherein N is greater than two; and
    the control logic is to:
       determine a selected voltage source from the first voltage source and the second voltage sources, the selected voltage source to be converted by the ADC and be set as the sampled voltage; and
       cause the N:1 ADC input channel to route the selected voltage source of the first voltage source and the second voltages sources to the ADC.

15. A method for controlling a first t-switch comprising an input port arranged to be connected to a first voltage source, a center-tap port, and an output port arranged to be connected to a load, the method comprising:
    connecting the input port to the output port in an on mode;
    disconnecting the input port from the output port in an off mode; and
    generating a bias voltage coupled to the center-tap port of the first t-switch, wherein the bias voltage determined based upon a voltage of the output port, and wherein the bias voltage is determined independent of any voltage downstream of the output port.

16. The method of claim 15 further comprising buffering the output port voltage to generate the bias voltage.

17. The method of claim 15 further comprising adding an offset voltage to the output port voltage to generate the bias voltage.

18. The method of claim 15 further comprising, in the off mode, causing the first t-switch to connect the bias voltage on the center-tap port to a midpoint between the input port and the output port of the first t-switch.

19. The method of claim 15, further comprising, in the on mode, causing the first t-switch to disconnect the bias voltage on the center-tap port from a midpoint between the input port and from the output port of the first t-switch.

20. The method of claim 15, the method for additionally controlling a plurality of second t-switches, wherein each second t-switch includes an input port to be connected to a respective second voltage source, a center-tap port coupled to the generated bias voltage, and an output port to be connected to the load, the method further comprising:
- selecting one of the first t-switch and the second t-switches;
- setting the selected one of the first t-switch and the second t-switches to the on mode; and
- setting all remaining ones of the first t-switch and the second t-switches to the off mode.

* * * * *